United States Patent [19]
Edwards

[11] Patent Number: 5,994,971
[45] Date of Patent: Nov. 30, 1999

[54] OSCILLATOR USING A TIME CONSTANT CIRCUIT BASED ON CYCLIC HEATING AND COOLING

[75] Inventor: William Ernest Edwards, St. Paul, Minn.

[73] Assignee: STMicroelectronics, Inc., Carrollton, Tex.

[21] Appl. No.: 08/995,192

[22] Filed: Dec. 22, 1997

[51] Int. Cl.$^6$ .................................................. H03K 3/0231

[52] U.S. Cl. .................................. 331/107 R; 331/108 C; 331/111

[58] Field of Search .................................. 331/66, 69, 70, 331/107 R, 111, 143, 108 C, 108 D

[56] References Cited

U.S. PATENT DOCUMENTS

| | | | |
|---|---|---|---|
| 3,500,243 | 3/1970 | Polin | 331/107 R |
| 3,766,444 | 10/1973 | Bosch | 331/60 |
| 3,794,863 | 2/1974 | Emerson | 331/111 |

*Primary Examiner*—Siegfried H. Grimm
*Attorney, Agent, or Firm*—Theodore E. Galanthay; Lisa K. Jorgenson; Andre M. Szuwalski

[57] ABSTRACT

A clock generator or oscillator circuit for use in an integrated circuit for generating a clock signal includes a 555 timer circuit. The time constant circuit of the 555 timer includes a heater element for generating heat and a transducer for converting heat generated by the heater element into electrical energy. The clock signal is generated in response to the heating and cooling of the heater element.

24 Claims, 3 Drawing Sheets

OSCILLATOR USING A TIME CONSTANT CIRCUIT BASED ON CYCLIC HEATING AND COOLING

FIELD OF THE INVENTION

The present invention relates to an apparatus and method for generating a clock signal and, in particular, an apparatus and method for generating a clock signal in an integrated circuit.

BACKGROUND OF THE INVENTION

In many integrated circuits and electronic applications, it is necessary to generate a low frequency (less than 100 hertz) clock or long time delay (greater than 20 mS). Historically, clock signals for integrated circuits are generated with (1) a crystal oscillator, for precise and stable frequencies, (2) an off-chip resistor and/or capacitor, or (3) on-chip capacitors, resistors, and current sources. Low frequencies or long delay times can be derived from those relatively fast clocks by binary division of the original signal with flip-flops. Each of the stated cases requires many flip-flops and/or off-chip components.

What is needed is an apparatus and method for generating a low frequency clock (less than 100 Hz) or a long time delay (greater than 20 mS) on an integrated circuit without the use of CMOS logic, metal oxide silicon capacitors (MOS), or off-chip components.

SUMMARY OF THE INVENTION

Accordingly, an embodiment of the present invention provides a clock generator circuit for generating a clock signal comprising a time constant circuit. The time constant circuit includes a heater element for generating heat and a transducer for converting heat generated by the heater element into electrical energy wherein the clock signal is generated in response to heating and cooling of the heater element.

Another embodiment of the present invention also provides an integrated circuit including a clock generator circuit for generating a clock signal comprising a time constant circuit. The time constant circuit includes a heater element for generating heat and a transducer for converting heat generated by the heater element into electrical energy wherein the clock signal is generated in response to heating and cooling of the heater element.

Yet another embodiment of the present invention provides a method of generating a clock signal in an integrated circuit. The method includes the steps of applying a control signal to a heating element to generate heat, applying the heat generated by the heating element to a transducer that converts the heat into electrical energy, and allowing the heating element to cool to generate an oscillating signal corresponding to the clock signal in response to heating and cooling of the heating element.

An advantage of the present invention is providing a very low frequency clock signal for an integrated circuit without the use of traditional time constant elements, such as capacitors or resistors, or the use of combination logic, such as dividers.

The present invention provides the advantage of an internal clock for an integrated circuit having low frequencies.

DETAILED DESCRIPTION OF A PREFERRED EMBODIMENT OF THE INVENTION

In general, the present invention replaces the traditional electrical components in the time constant circuit of a 555 timer with thermal equivalents wherein heat flow is analogous to current and temperature is analogous to voltage. Thus, the present invention utilizes a 555 timer to generate a clock signal according to the present invention.

Figure 1:
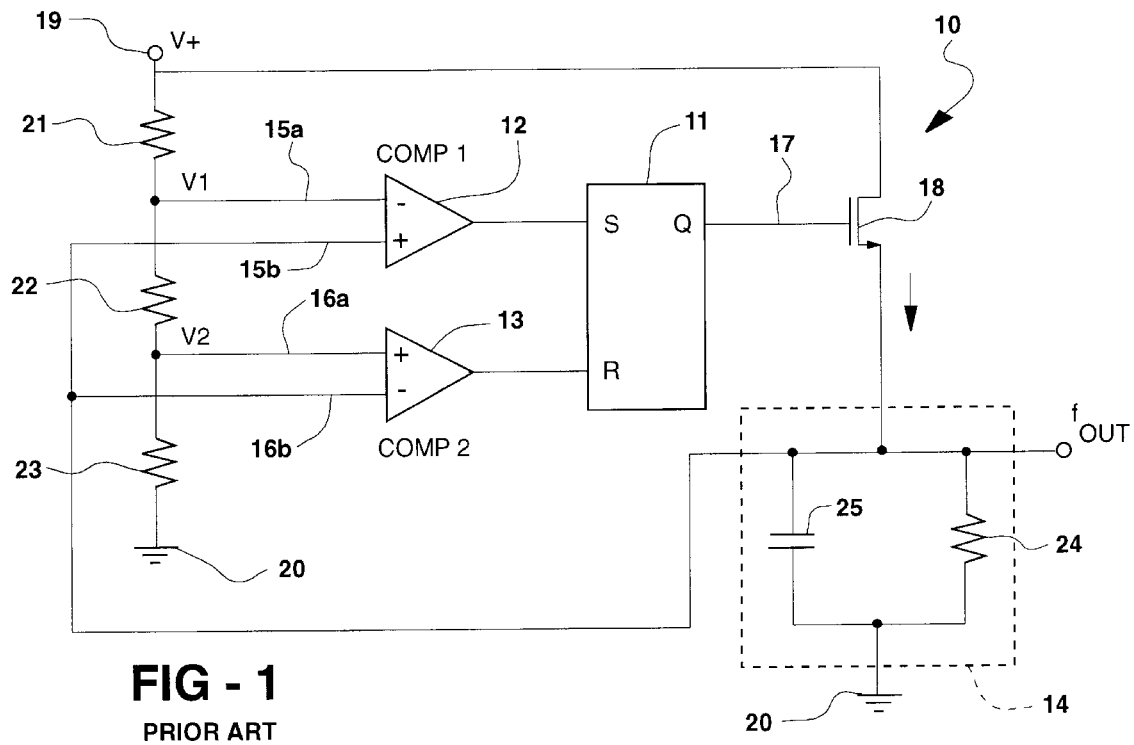
FIG. 1 is a prior art circuit diagram of a 555 timer having a time constant circuit comprising a resistor and a capacitor.

FIG. 1 illustrates a well known prior art 555 timer circuit 10 for generating a clock signal. 555 timer 10 comprises an SR latch 11 having an S input, an R input, and a Q output 17. 555 timer 10 further includes a comparator 12 having a first input 15a and a second input 15b and a comparator 13 having a first input 16a and a second input 16b. Comparator 12 has its output coupled to the S input of SR latch 11, and comparator 13 has its output coupled to the R input of SR latch 11. Three resistors 21, 22, 23 are coupled in series to a voltage source 19 and ground 20 to establish a first voltage reference inputted to input 15a of comparator 12 and a second voltage reference inputted to input 16a of comparator 13.

555 timer 10 further includes a transistor 18 and a time constant circuit 14 for establishing the period of the clock signal. Time constant circuit 14 comprises a resistor 24 parallelly coupled to a capacitor 25 for establishing an RC time constant. Time constant circuit 14 is coupled between ground 20 and the source of transistor 18. The gate of transistor 18 is coupled to Q output 17 of SR latch 11. The drain of transistor 18 is coupled to voltage source 19. Time constant circuit 14 is coupled to inputs 15b and 16b of SR latch 11. SR latch 11 is set and reset upon the charging and discharging of capacitor 25 as is well known in the art.

Figure 2:
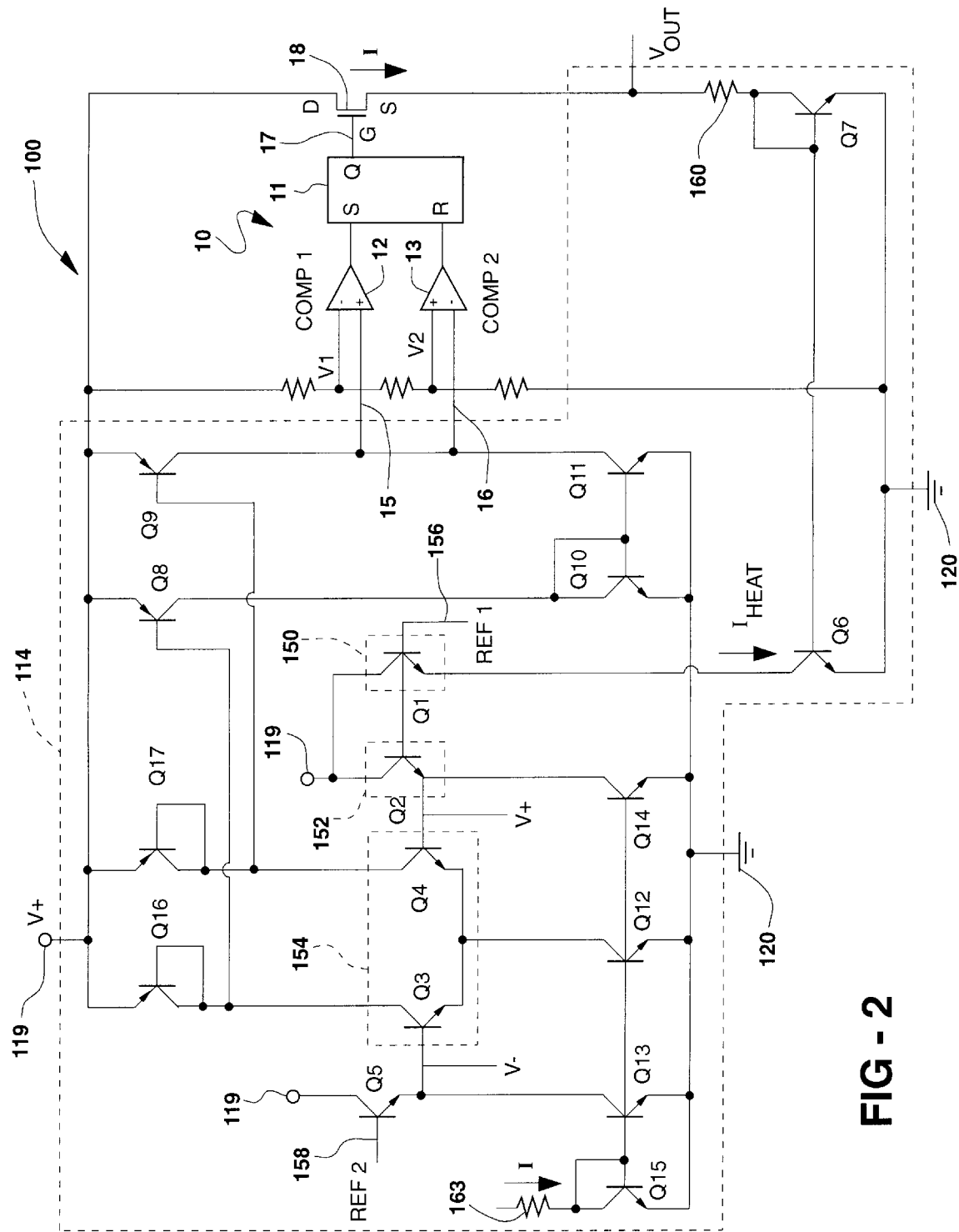
FIG. 2 is a circuit diagram of a clock generator circuit according to the present invention.

FIG. 2 illustrates an exemplary clock generator circuit 100 according to the present invention. Clock generator circuit 100 is preferably implemented in an integrated circuit. However, it will be appreciated that clock generator circuit 100 may be implemented external to an integrated circuit. Reference numerals utilized in FIG. 2 which are like or similar to reference numerals utilized in FIG. 1 indicate like, similar, or identical components. In particular, clock generator circuit 100 comprises a 555 timer 10 as used in FIG., 1 with the following modifications to time constant circuit 14. However, it will be appreciated that the present invention is not restricted to 555 timer architectures.

Clock generator circuit 100 comprises a time constant circuit 114 including a heater element 150 for generating heal and a transducer 152 for converting heat generated by heater element 150 into electrical energy wherein the clock signal is generated in response to heating and cooling of heater element 150. Time constant circuit 114 is coupled to second inputs 15, 16 of comparators 12 and 13, respectively. Time constant circuit 114 is also coupled to output 17 of SR latch 11 via transistor 18.

Figure 4:
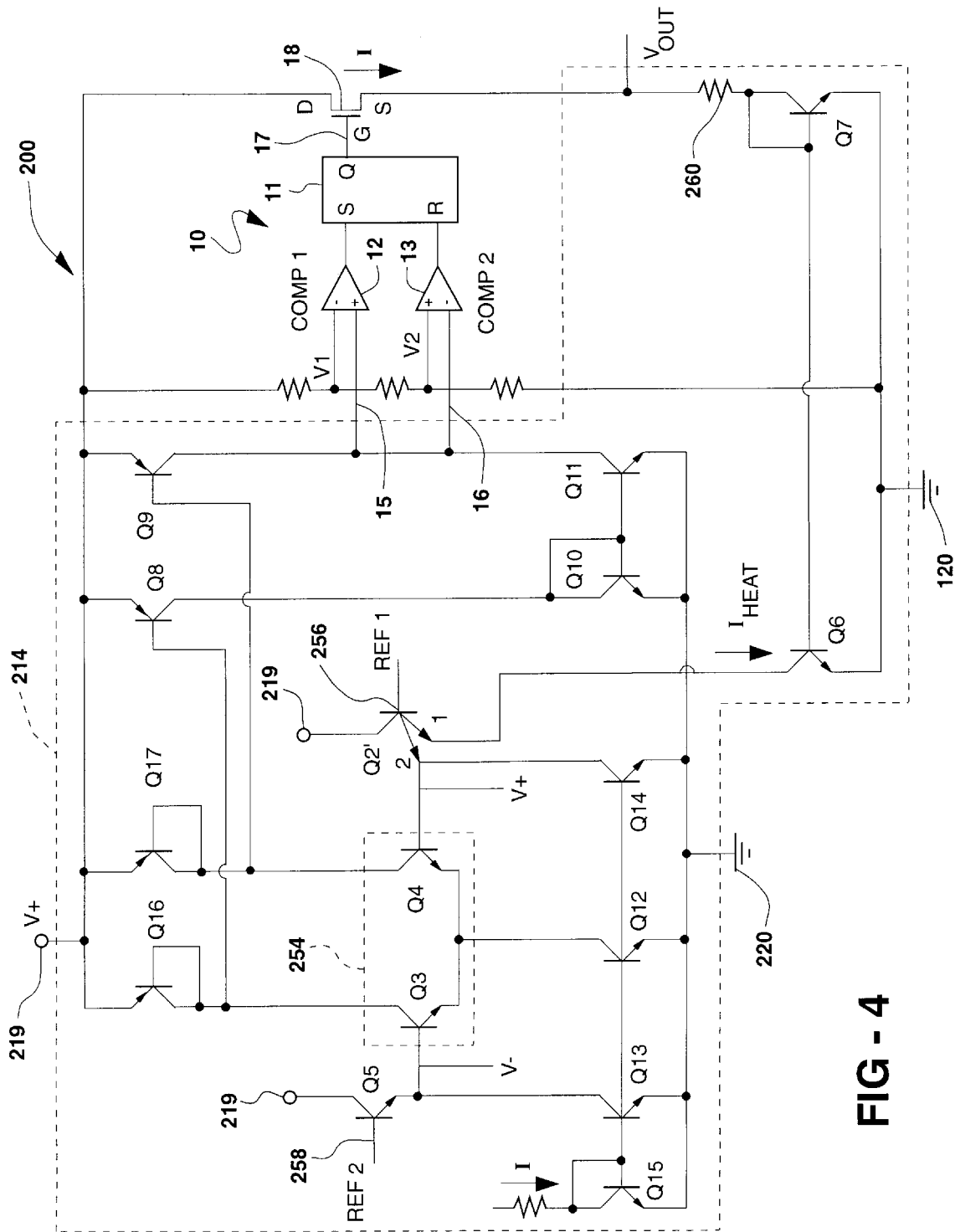
FIG. 4 is an alternative embodiment of the present invention.

Heating element 150 comprises a first transistor Q1 and transducer 152 comprises a second transistor Q2 operably associated with first transistor Q1 such that first transistor Q1 transfers heat to second transistor Q2. It will be appreciated that heating element 150 and transducer 152 can be in many forms, such as interdigitated MOS transistors, multiple emitters in bipolar junction transistors as illustrated in FIG. 4 to be described in detail, or polysilicon resistors over base emitter junctions or diffused resistors.

Time constant circuit 114 further includes a differential transistor pair 154 comprising transistors Q3 and Q4. The collectors of transistors Q1 and Q2 are coupled to voltage source 119. The base of transistor Q1 is coupled to the base of transistor Q2. The emitter of transistor Q1 is located in close proximity to the emitter of transistor Q2 such that the emitter of transistor Q1 transfers heat to transistor Q2. The emitter of transistor Q2 is coupled to the base of transistor Q4. The emitter of transistor Q4 is coupled to the emitter of transistor Q3.

Time constant circuit 114 further includes a transistor Q5. The emitter of transistor Q5 is coupled to the base of transistor Q3, and the collector of transistor Q5 is coupled to voltage source 119.

Time constant circuit 114 further includes a first voltage input 156 coupled to the base of transistors Q1 and Q2 and a second voltage input 158 coupled to the base of transistor Q5.

Time constant circuit 114 further includes transistors Q6 and Q7. The emitter of transistor Q1 is coupled to the collector of transistor Q6. The emitter of transistor Q6 is coupled to the emitter of transistor Q7 which, in turn, is coupled to ground 120. The base of transistor Q6 is coupled to the base of transistor Q7, and the base of transistor Q7 is coupled to the collector of transistor Q7. A resistor 160 couples the source of transistor 18 to the collector of transistor Q7.

Time constant circuit 114 further includes transistors Q8, Q9, Q10, and Q11. The collector of transistor Q3 is coupled to the base of transistor Q8. The collector of transistor Q4 is coupled to the base of transistor Q9. The emitters of transistors Q8 and Q9 are coupled to voltage source 119. The collector of transistor Q8 is coupled to the collector of transistor Q10, and the collector of transistor Q9 is coupled to the collector of transistor Q11. The base of transistor Q10 is coupled to the base of transistor Q11. The base of transistor Q10 is coupled to the collector of transistor Q10, and the emitters of transistors Q10 and Q11 are coupled to ground 120. The collectors of transistors Q9 and Q11 are coupled to comparator inputs 15 and 16.

Time constant circuit 114 further includes transistor Q12. The emitters of transistors Q3 and Q4 are coupled to the collector of transistor Q12. The emitter of transistor Q12 is coupled to ground 120.

Time constant circuit 114 further includes transistors Q13, Q14, and Q15. The base of transistor Q12 is coupled to the base of transistor Q14, the base of transistor Q13 and the base of transistor Q15. The emitters of transistors Q13, Q14, and Q15 are coupled to ground 120. The collector of transistor Q14 is coupled to the emitter of transistor Q2. The collector of transistor Q13 is coupled to the emitter of transistor Q5. The collector of transistor Q15 is coupled to the base of transistor Q15 and to a resistor 163.

Time constant circuit 114 further includes transistors Q16 and Q17. The emitters of transistors Q16 and Q17 are coupled to voltage source 119. The collector of transistor Q16 is coupled to the collector of transistor Q3, whereas the collector of transistor Q17 is coupled to the collector of transistor Q4. The base of transistor Q16 is coupled to the collector of transistor Q16, and the base of transistor Q17 is coupled to the collector of transistor Q17.

The operation of the circuit depicted in FIG. 2 will now be described. The present invention takes advantage of the well-known voltage variation in semiconductor devices or resistive type devices as a function of temperature. Assuming transistor 18 is turned on by a "high" output Q of SR latch 11, then a current $I_{out}$ flows from the drain of transistor 18, through the source of transistor 18, through resistor 160 and to the collector of transistor Q7. Since transistors Q6 and Q7 are configured to form a current mirror, a current $I_{heat}$ flowing through transistor Q1 to the collector of transistor Q6 mirrors current $I_{out}$, or in other words $I_{heat}$ substantially equals current $I_{out}$. Power, such as $I_{heat}*Vbe_1$, in transistor Q1 heats transistor Q2. It is important to note that transistor Q5 is not heated by transistor Q1. As the temperature in transistor Q2 rises, the voltage across the base and emitter of transistor Q2 ($Vbe_2$) decreases. Thus, transistors Q1 and Q2 perform the function of a current controlled temperature to voltage converter wherein the voltage varies as temperature varies. Voltage V+, the voltage at the base of transistor Q4, increases as the temperature in transistor Q2 rises, since the voltage drop $Vbe_2$ decreases, and since $V+=Vref_1-Vbe_2$ where $Vref_1$ is the voltage applied to first voltage input 156. Voltage V−, the voltage at the base of transistor Q3, remains relatively constant, since the temperature of transistor Q5 remains unaffected by the heating of transistor Q2 which keeps $Vbe_2$ (the voltage across the base and emitter of transistor Q5) relatively constant, and since $V-=Vref_2-Vbe_5$ where $Vref_2$ is the voltage applied to second voltage input 158.

Figure 3:
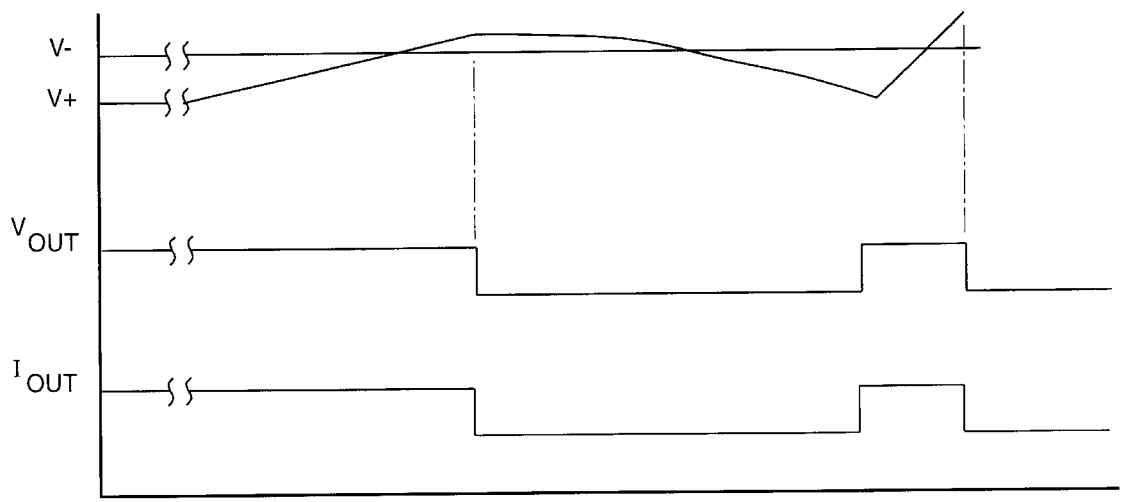
FIG. 3 is an exemplary timing diagram for the circuit of FIG. 2.

FIG. 3 is an example of a timing diagram for the circuit of FIG. 2 illustrating voltages V−, V+, and $V_{out}$ and current $I_{out}$ over time t. With voltage $V_{out}$ "on," current $I_{out}$ is also "on" and voltage V+ begins to rise as current $I_{heat}$ heats transistor Q2 and $Vbe_2$ decreases. Shortly after voltage V+ rises above voltage V−, transistors Q3 and Q4 cause comparator 13 to reset SR latch 11, causing output Q to go low. With output Q low, transistor 18 turns off, current $I_{out}$ turns off, and $V_{out}$ goes low. Since $I_{out}$ turns off, current $I_{heat}$ also turns off, allowing transistor Q1 to cool. As transistor Q1 cools, voltage $Vbe_2$ increases, causing voltage V+ to decrease Voltage V+ decreases below voltage V− until transistors Q3 and Q4 cause comparator 12 to set SR latch 11, causing output Q to go high. With output Q high, transistor 18 turns on, current $I_{out}$ turns on, and $V_{out}$ goes high. This process continues to create an oscillating $V_{out}$ signal.

Referring now to FIG. 4, an alternative embodiment according to the present invention is illustrated. Reference numerals used in FIG. 2 which are like or similar to reference numerals used in FIG. 4 indicate like, similar, or identical components.

FIG. 4 is provided to reinforce different forms that the heating element and transducer can take according to the present invention. Thus, the circuit in FIG. 4 is identical to the circuit in FIG. 2 except for the configuration of the heating element and transducer. The heating element and transducer of clock generator circuit 200 is fulfilled using a transistor Q2' having a first emitter acting as the heating element and a second emitter acting as the transducer. The collector of transistor Q2' is coupled to voltage source 219, and the base of transistor Q2' is coupled to first voltage input 256. The circuit of FIG. 4 operates in a similar fashion as the circuit of FIG. 2. Although not shown, a timing diagram for the circuit of FIG. 4 would be very similar to the timing diagram for the circuit of FIG. 2 as depicted in FIG. 3.

It will be appreciated that clock generator circuits 100, 200 can be implemented using bipolar junction transistors, MOSFETs, CMOS, or other technologies, and can also be. implemented using a resistor and a voltage divider. The time constant established by the time constant circuits can be controlled by controlling the distance from the heating element to the transducer element.

Although the present invention and its advantages have been described in detail, it should be understood that various; changes, substitutions and alterations can be made herein without departing from the spirit or scope of the invention as defined in the appended claims.

What is claimed is:

1. A clock generator circuit for generating a clock signal comprising:
   a time constant circuit including:
      a single heater element for generating heat in a periodic fashion in response to a periodic current flowing through said heater element; and
      a transducer in the form of a semiconductor device for converting heat generated by said heater element into electrical energy, said heater element and said transducer operating together to perform a function of a current controlled temperature to voltage converter wherein the clock signal is generated in response to at least one voltage output from said time constant circuit.

2. The circuit, as recited in claim 1, further comprising:
   a first comparator having a first input coupled to a first voltage reference, a second input coupled to a first voltage output of said at least one voltage output, and an output;
   a second comparator having a first input coupled to a second voltage reference, a second input coupled to a second voltage output of said at least one voltage output, and an output; and
   an SR latch having at least one output, an R input coupled to said output of said first comparator and an S input coupled to said output of said second comparator.

3. The circuit, as recited in claim 2, wherein said time constant circuit is coupled to said second inputs of said first and second comparators and to said output of said SR latch.

4. The circuit, as recited in claim 1, wherein said heater element comprises a first transistor and said transducer comprises a second transistor operably associated with said first transistor such that said first transistor transfers heat to said second transistor.

5. The circuit, as recited in claim 1, wherein said transducer comprises a first transistor and wherein a differential transistor pair is connected to an emitter of said first transistor.

6. The circuit, as recited in claim 1, wherein said time constant circuit further includes a transistor having a first emitter and a second emitter wherein said first emitter is said heater element and said second emitter is said transducer.

7. The circuit, as recited in claim 1, wherein said heater element comprises a resistor.

8. The circuit, as recited in claim 7, wherein said transducer comprises a transistor.

9. The circuit, as recited in claim 7, wherein said transducer comprises a second resistor.

10. The circuit, as recited in claim 5, wherein said time constant circuit further includes:
    a first voltage input operably coupled to said heater element;
    a transistor operably coupled to said differential transistor pair;
    a second voltage input operably coupled to said transistor; and
    wherein said transducer is operably coupled to said differential transistor pair such that voltage supply to said first and second voltage inputs control operation of said differential transistor pair.

11. The circuit, as recited in claim 1, further comprising a 555 timer such that at least one input of said 555 timer is connected to said at least one voltage output from said time constant circuit.

12. The circuit, as recited in claim 1, wherein the clock signal has a frequency less than 1 KHz.

13. An integrated circuit including a clock generator circuit for generating a clock signal comprising:
    a time constant circuit including:
       a heater element for generating heat in response to current flowing through said heater element; and
       a single transducer for converting heat generated by said heater element into electrical energy, said heater element and said transducer operating together to perform a function of a current controlled temperature to voltage converter wherein the clock signal is generated in response to a first voltage output and a second voltage output from said time constant circuit.

14. The integrated circuit, as recited in claim 13, wherein said clock generator circuit further comprises:
    a first comparator having a first input coupled to a first voltage reference, a second input coupled to said first voltage output, and an output;
    a second comparator having a first input coupled to a second voltage reference, a second input coupled to said second voltage output, and an output; and
    an SR latch having at least one output, an R input coupled to said output of said first comparator and an S input coupled to said output of said second comparator.

15. The integrated circuit, as recited in claim 14, wherein said time constant circuit is coupled to said second inputs of said first and second comparators and to said output of said SR latch.

16. The integrated circuit, as recited in claim 13, wherein said heater element comprises a first transistor and said transducer comprises a second transistor operably associated with said first transistor such that said first transistor transfers heat to said second transistor.

17. The integrated circuit, as recited in claim 13, wherein said transducer comprises a first transistor and wherein a differential transistor pair is connected to an emitter of said first transistor.

18. The integrated circuit, as recited in claim 13, wherein said time constant circuit further includes a transistor having a first emitter and a second emitter wherein said first emitter is said heater element, and said second emitter is said transducer.

19. The integrated circuit, as recited in claim 13, wherein said heater element comprises a resistor.

20. The integrated circuit, as recited in claim 19, wherein said transducer comprises a transistor.

21. The integrated circuit, as recited in claim 19, wherein said transducer comprises a second resistor.

22. The integrated circuit, as recited in claim 17, wherein said time constant circuit further includes:
    a first voltage input operably coupled to said heater element;
    a transistor operably coupled to said differential transistor pair;

a second voltage input operably coupled to said transistor; and wherein said transducer is operably coupled to said differential transistor pair such that voltage supply to said first and second voltage inputs control operation of said differential transistor pair.

23. The integrated circuit, as recited in claim 13, further comprising a 555 timer circuit such that at least one input of said 555 timer circuit is connected to at least one of said first voltage output and second voltage output from said time constant circuit.

24. The integrated circuit, as recited in claim 13, wherein the clock signal has a frequency less than 1 KHz.

* * * * *